United States Patent [19]

Ogata et al.

[11] Patent Number: 5,020,009
[45] Date of Patent: May 28, 1991

[54] METHOD AND APPARATUS FOR PREPARING MEASUREMENT SPECIFICATIONS OF ELECTRONIC CIRCUITS

[75] Inventors: Teruaki Ogata; Yuko Sudou, both of Itami, Japan

[73] Assignee: Mitsubishi Denki Kabushiki Kaisha, Japan

[21] Appl. No.: 327,042

[22] Filed: Mar. 22, 1989

[30] Foreign Application Priority Data

Jan. 19, 1989 [JP] Japan ................................. 1-8682

[51] Int. Cl.$^5$ .......................................... G01R 31/28
[52] U.S. Cl. .................................. 364/580; 364/489; 371/27
[58] Field of Search ............... 364/579, 580, 489–491; 371/20.4, 21.1, 27

[56] References Cited

U.S. PATENT DOCUMENTS

| | | | |
|---|---|---|---|
| 3,622,762 | 11/1971 | Dyer | 364/489 |
| 4,550,406 | 10/1985 | Neal | 371/27 |
| 4,584,653 | 4/1986 | Chih et al. | 364/491 |
| 4,612,618 | 9/1986 | Pryor et al. | 364/490 |
| 4,613,940 | 9/1986 | Shenton et al. | 364/490 |
| 4,638,442 | 1/1987 | Bryant et al. | 364/489 |
| 4,862,399 | 8/1989 | Freeman | 364/580 |

FOREIGN PATENT DOCUMENTS

1133589 1/1985 U.S.S.R. ................... 364/580

OTHER PUBLICATIONS

House, "Development System Lays Basis for Fully Integrated VLSI Design Center", Electronics (2/28/80), vol. 53, No. 5, pp. 143–147.

Groner, "Computer Aided Design of VLSI Saves Man-Hours, Reduces Errors", Control Engineering (Apr. 1981), pp. 55–57.

Trimberger, "Automating Chip Layout", IEEE Spectrum, Jan. 1982) pp. 38–45.

Primary Examiner—Felix D. Gruber
Attorney, Agent, or Firm—Leydig, Voit & Mayer

[57] ABSTRACT

A method for preparing the measurement specifications of an electronic circuit comprises the steps of preparing testing peripheral circuit diagrams for individual measurement items by adding standardized testing peripheral circuit modules to the basic peripheral circuit diagram of the electronic circuit, preparing an overall testing peripheral circuit diagram for use in making measurements corresponding to all the measurement items by synthesizing these testing peripheral circuit diagrams with one another, and preparing measurement specifications for individual measurement items for use in making measurements employing the overall testing peripheral circuit diagram, from the overall testing peripheral circuit diagram and the testing peripheral circuit diagrams. An apparatus for carrying out such a method has an input device, a data base, a section for preparing testing peripheral circuit diagrams for individual measurement items, a section for preparing an overall testing peripheral circuit diagram by synthesization, a section for preparing measurement specifications for individual measurement items, and an output device for outputting the measurement specifications thus prepared.

5 Claims, 6 Drawing Sheets

METHOD AND APPARATUS FOR PREPARING MEASUREMENT SPECIFICATIONS OF ELECTRONIC CIRCUITS

BACKGROUND OF THE INVENTION

1. Field of the Invention

This invention relates to a method for preparing measurement specifications which are used when the properties of electronic circuits such as semiconductor integrated circuits (hereinafter referred to as "IC(s)") are measured by means of a measurement apparatus or the like, as well as an apparatus for carrying out such a method.

1. Description of the Related Art

In general, after electronic circuits such as IC's have been manufactured following circuit design, their properties are measured and tested by means of a measurement apparatus called a general-purpose IC testing system. This type of measurement apparatus is generally equipped with a plurality of components such as signal generators and measuring devices, and is designed to activate these components in accordance with predetermined measurement programs, thereby enabling performance of various measurements and tests.

Figure 7:
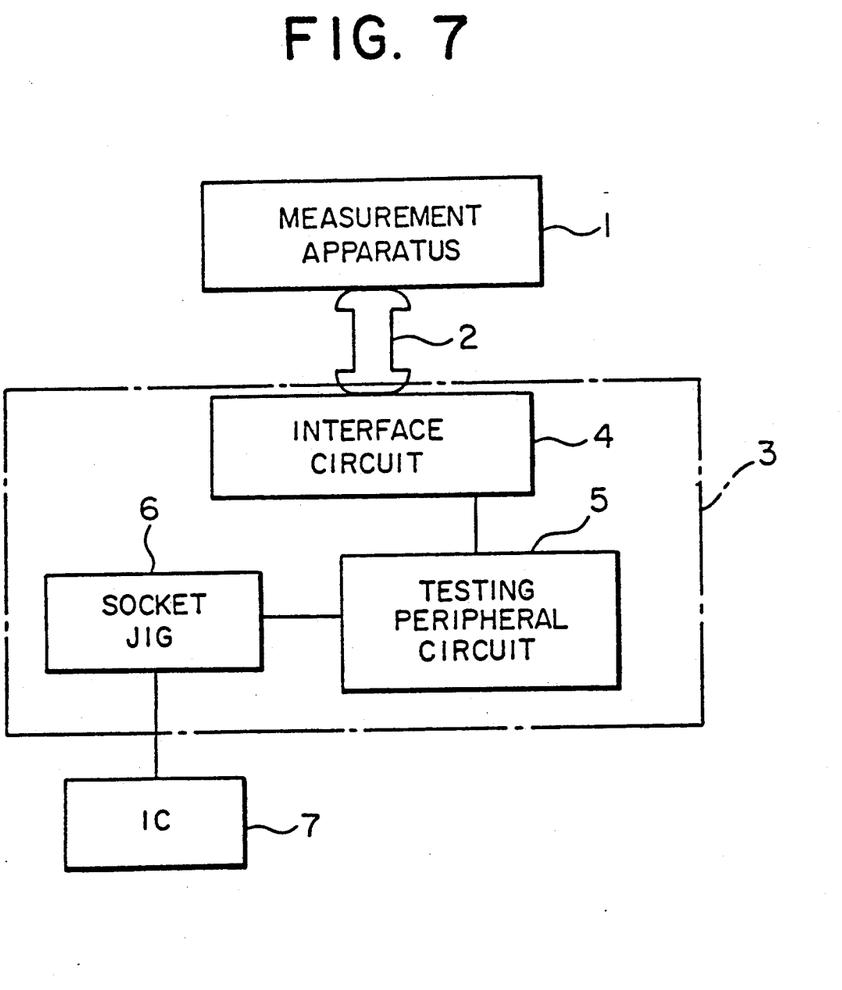
FIG. 7 is a block diagram showing a conventional apparatus for making measurements of electronic circuits.

FIG. 7 is a block diagram schematically showing the overall arrangement used for measuring the properties of electronic circuits by means of such a measurement apparatus. A measurement apparatus 1 is connected to a measurement jig 3 by a connection cable 2. The measurement jig 3 includes an interface circuit 4 connected to the connection cable 2, a testing peripheral circuit 5, and a socket jig 6. An IC 7 which is an object to be tested is connected to the socket jig 6. The testing peripheral circuit 5 includes a multiplicity of change-over switches (relays) so as to create peripheral conditions under which the IC 7 is actually used and to enable testing of the IC 7.

The measurement apparatus 1 is activated in accordance with a particular measurement program to input an electric signal to the IC 7 through the interface circuit 4 and the testing peripheral circuit 5, thereby activating the IC 7. The output of the IC 7 is transferred to the measurement apparatus 1 through the testing peripheral circuit 5 and the interface circuit 4, and measured by the measurement apparatus 1. In this way, various tests on the IC 7 are performed on the basis of the particular measurement program.

The measurement jig 3 and the measurement program used for activating the measurement apparatus 1 are provided exclusively for the circuit design of the IC 7 to be tested, and have heretofore been prepared in accordance with the following procedure.

Step 1: Measurement items are selected on the basis of the device specifications prepared during designing of the IC 7 to prepare a measurement standard for the IC 7.

Step 2: An actual measurement method is examined.

Step 3: A measurement apparatus for use in measurement is selected on the basis of the result of the examination of Step 2.

Step 4: The testing peripheral circuit 5 and the interface circuit 4, both of which are required to make measurements of the IC 7 in accordance with all the measurement items by using the measurement apparatus selected, are designed and the corresponding measurement specifications are prepared.

Step 5: The testing peripheral circuit 5 and the interface circuit 4 are produced, and they are connected to each other with the socket jig 6 connected to the testing peripheral circuit 5, thus completing the measurement jig 3.

Step 6: The measurement specifications prepared in Step 4 are classified into specifications corresponding to each individual measurement item, and a measurement program based on a language form used exclusively for the measurement apparatus 1 is prepared.

The measurement program has heretofore been prepared by the method including the steps described above. However, a knowledge of both hardware and software of the measurement apparatus 1 is necessary for the preparation of the measurement specifications referred to in Step 4. For this reason, the above method has the problem that expert test engineers having considerable experience must take charge of the preparation of the measurement specifications, and the qualities of the measurement specifications and the measurement program are seriously affected by the extent of knowledge of an engineer in charge. In addition, the method involves the problem that, if any engineer other than one who prepared the measurement specifications is to debug the measurement program or the testing peripheral circuit, a great deal of time and work are required for preparing new measurement specifications relative to the testing peripheral circuit after completion of debugging.

SUMMARY OF THE INVENTION

It is therefore an object of the present invention to provide a method for preparing the measurement specifications of electronic circuits, in which it is possible to easily and efficiently prepare the measurement specifications of electronic circuits such as IC's, as well as an apparatus for carrying out such a method.

A method for preparing the measurement specifications of an electronic circuit, according to the present invention comprises the steps of preparing a plurality of testing peripheral circuit diagrams for individual measurement items by adding standardized testing peripheral circuit modules to a basic peripheral circuit diagram of the electronic circuit, preparing an overall testing peripheral circuit diagram for use in making measurements corresponding to all the measurement items by synthesizing these plurality of testing peripheral circuit diagrams with one another, and preparing measurement specifications for individual measurement items for use in making measurements employing the overall testing peripheral circuit diagram, from the overall testing peripheral circuit diagram and the plurality of testing peripheral circuit diagrams.

An apparatus for preparing measurement specifications according to the present invention includes input means used for inputting the measurement items and measurement standard of the electronic circuit, a data base for storing the basic peripheral circuit diagram of the electronic circuit and a plurality of testing peripheral circuit modules which are standardized in advance, testing peripheral circuit diagram preparing means for preparing a plurality of testing peripheral circuit diagrams for individual measurement items by adding the testing peripheral circuit modules stored in the data base to the basic peripheral circuit diagram stored in the data base on the basis of the measurement items and measurement standard of the electronic circuit both of which are input from the input means, overall testing peripheral circuit diagram preparing means for preparing an overall testing peripheral circuit diagram for use in making measurements corresponding to all the measurement items by synthesizing the plurality of testing peripheral circuit diagrams with one another, measurement specification preparing means for preparing measurement specifications for individual measurement items for use in making measurements employing the overall testing peripheral circuit diagram, from the overall testing peripheral circuit diagram and the plurality of testing peripheral circuit diagrams prepared by the testing peripheral circuit diagram preparing means, and output means for outputting the measurement specifications prepared by the measurement specification preparing means.

DESCRIPTION OF THE PREFERRED EMBODIMENT

An embodiment of the present invention will be described below with reference to the accompanying drawings.

Figure 1:
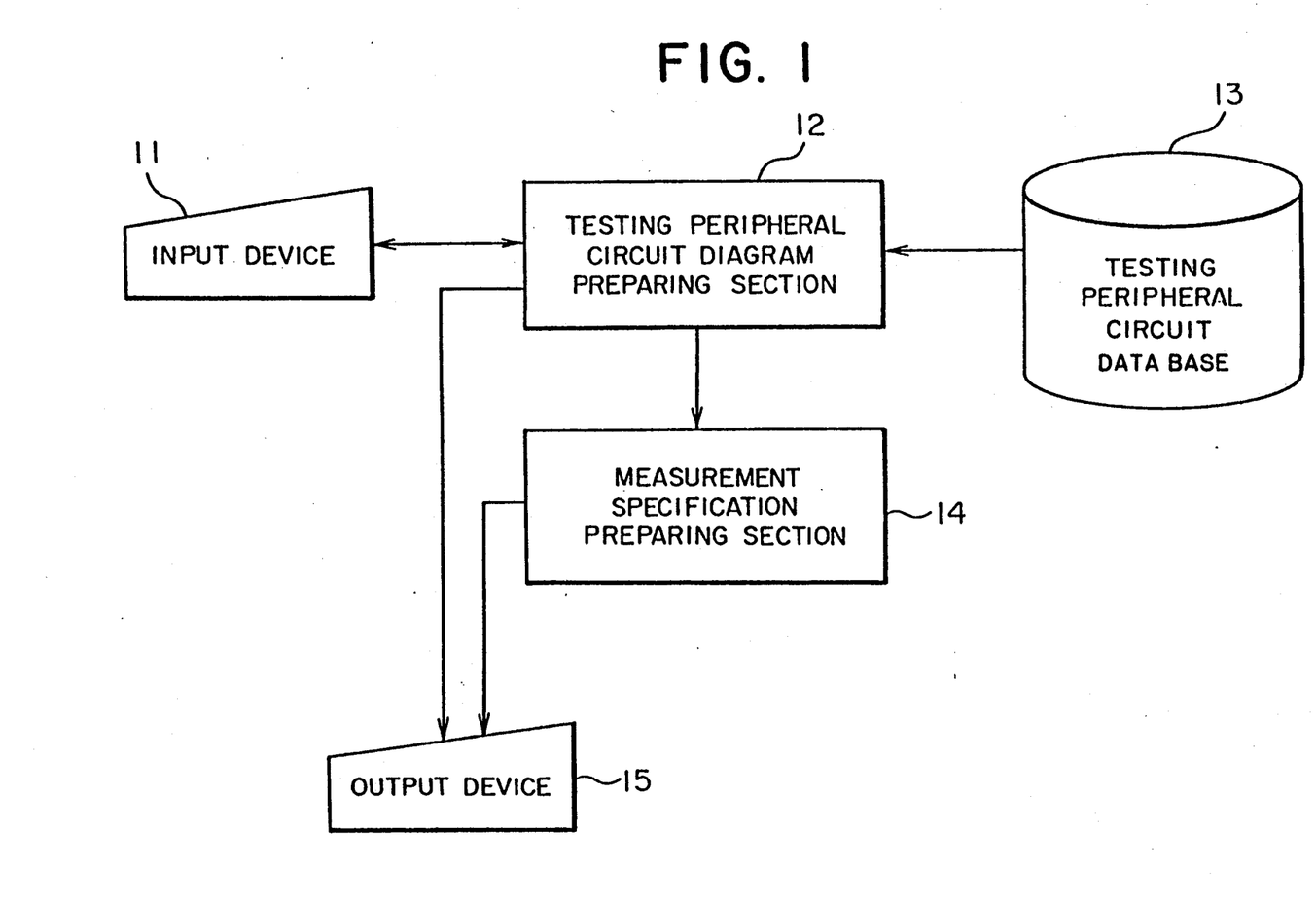
FIG. 1 is a block diagram of an embodiment of an apparatus for preparing the measurement specifications of electronic circuits.

Referring to FIG. 1, an apparatus for preparing measurement specifications includes an input device 11 used for inputting basic measurement specifications corresponding to individual measurement items and a peripheral circuit diagram of an electronic circuit which is an object to be tested. The input device 11 is provided with a keyboard (not shown) and a display (not shown) such as a CRT. A testing peripheral circuit diagram preparing section 12 for preparing circuit diagrams of testing peripheral circuits required to measure the electronic circuit is connected to the input device 11. A testing peripheral circuit data base 13 which stores general basic peripheral circuit diagrams of electronic circuits and a plurality of testing peripheral circuit modules which are standardized in advance is connected to the testing peripheral circuit diagram preparing section 12, and a measurement specification preparing section 14 for preparing measurement specifications used for making measurements of an electronic circuit by means of the testing peripheral circuits is also connected to the testing peripheral circuit diagram preparing section 12. An output device 15 for outputting testing peripheral circuit diagrams and written measurement specifications is connected to both the testing peripheral circuit diagram preparing section 12 and the measurement specification preparing section 14.

Figure 2:
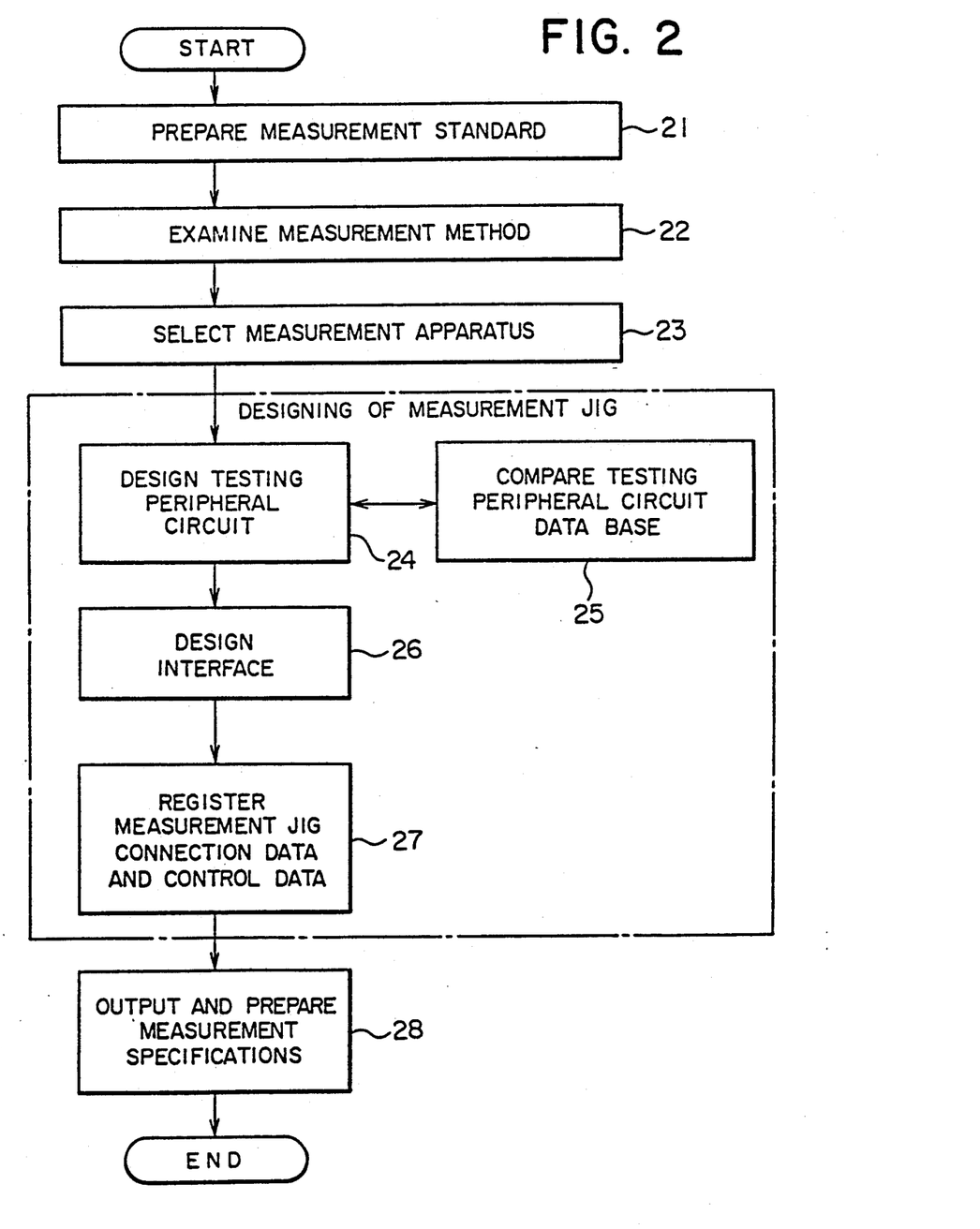
FIG. 2 is a flow chart showing the operation of the apparatus of FIG. 1.

Next, a method for preparing the measurement specifications of an electronic circuit will be described below with reference to the flow chart of FIG. 2.

In Step 21, particular measurement items of an electronic circuit to be tested are selected, and thus a measurement standard is prepared. In Step 22, it is examined what method is actually used to make measurements based on the measurement standard. In Step 23, a measurement apparatus suitable for use in the measurements is selected on the basis of the result of the examination.

Then, a measurement jig is designed. The measurement jig is needed to make measurements of the electronic circuit in accordance with all the measurement items by using the measurement apparatus selected. The measurement jig includes a testing peripheral circuit having the circuitry required for assuring the normal performance of the function of the electronic circuit and a switching circuit for effecting switching of measurement conditions, and a family board section arranged to provide connection between the testing peripheral circuit and the measurement apparatus and to enable selection from among a plurality of input/output signal paths as well as to implement the requisite signal processing upon input and output signals. Incidentally, the family board section is of a standardized type which is not exclusively provided for the electronic circuit which is an object to be tested. The family board section is prepared in advance.

First, designing of the testing peripheral circuit is carried out in Step 24. In Step 24, the measurement standards prepared in Step 21 are input through the keyboard of the input device 11. Then, the testing peripheral circuit diagram preparing section 12 reads the basic peripheral circuit diagram of the electronic circuit from the testing peripheral circuit data base 13 to display such a circuit diagram on the display of the input device 11. Simultaneously, the testing peripheral circuit diagram preparing section 12 sequentially displays, on the display of the input device 11, questions concerning testing peripheral circuit modules which are to be added to the basic peripheral circuit diagram, in correspondence with the individual measurement items on the basis of the measurement standard input from the keyboard and in a conversational mode using a general language. When an operator answers the questions displayed on the display and specifies the requisite testing peripheral circuit modules from the keyboard, the process proceeds to Step 25, in which the testing peripheral circuit diagram preparing section 12 reads the desired testing peripheral circuit modules from the testing peripheral circuit data base 13, superimposes the circuit modules on the basic peripheral circuit diagram which is previously output at the display of the input device 11, and displays the synthesized image. When all the requisite testing peripheral circuit modules corresponding to one measurement item are added to the basic peripheral circuit diagram, the preparation of the testing peripheral circuit diagram for the relevant measurement item has been completed.

After the testing peripheral circuit diagram for each individual measurement item has been prepared, the testing peripheral circuit diagram preparing section 12 synthesizes these plurality of testing peripheral circuit diagrams to prepare an overall testing peripheral circuit diagram which enables measurement of all the measurement items. The overall testing peripheral circuit diagram can be output from the output device 15.

Then, in Step 26, designing of an interface circuit for connecting the overall testing peripheral circuit to the hardware of the measurement apparatus is carried out. If it is necessary, at this time, to implement any processing, such as voltage amplification, of the input or output signals of the electronic circuit, an appropriate testing peripheral circuit module is specified from the keyboard of the input device 11 and thus the specified module is read from the testing peripheral circuit data base 13 and inserted into a signal path in the family board section. Thus, the interface circuit is easily designed.

Thereafter, in Step 27, various kinds of data, such as connection data for the signal paths in the designed overall testing peripheral circuit and interface circuit as well as control data for switches, are registered in a dedicated data base or the testing peripheral circuit data base 13.

Then, in Step 28, the measurement specification preparing section 14 prepares measurement specifications for each individual measurement item which are used when the electronic circuit is measured by means of the overall testing peripheral circuit, on the basis of the overall testing peripheral circuit diagram and the testing peripheral circuit diagram for each individual measurement item, the diagrams being prepared by the testing peripheral circuit diagram preparing section 12. At this time, the overall testing peripheral circuit diagram is compared to each testing peripheral circuit diagram and, input/output signal paths, the state of setting of switches, conditions for application of voltage and current, and so forth are added to the overall testing peripheral circuit diagram, thus preparing a measurement specification for each measurement item in the form of a figure. These measurement specifications are output from the output device 15. As required, the measurement specification preparing section 14 prepares a tabulated measurement specification in which the measurement specifications for the respective measurement items are tabulated.

In this manner, the measurement specifications for the respective measurement items of the electronic circuit are prepared.

A concrete example of the embodiment which is used to prepare measurement specifications is described below.

Figure 3:
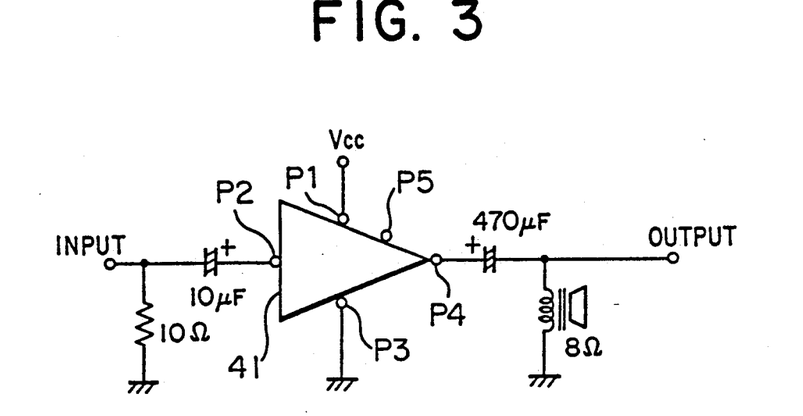
FIG. 3 is a circuit diagram showing an electronic circuit which constitutes an object to be tested in the embodiment, as well as the state of peripheral circuits of the electronic circuit when in use.

FIG. 3 shows an IC 41 for sound amplification and the state of peripheral circuits of the IC 41 when in use. The IC 41 has five pins P1–P5 and, it is assumed that, for example, the measurement standard shown in the following Table 1 is prepared on the basis of the device specification of the IC 41 as described with respect to Step 21 of the flow chart of FIG. 2.

TABLE 1

| | | Measurement Standard | | | | |
| --- | --- | --- | --- | --- | --- | --- |
| | | Measurement | | Standard value | | |
| Symbol | Item | condition | Minimum | Standard | Maximum | Unit |
| Gv | Voltage gain | f = 1 kHz<br>Vin = 1 mVrms | 43 | 46 | 49 | DB |
| THD | Total harmonic distortion | f = 1 kHz<br>Vout = 1 mVrms | | 0.05 | 0.1 | % |
| Fb | Frequency characteristic | f = kHz<br>Vin = 1mVrms | −0.3 | 0 | +0.3 | DB |
| Ni | Noise voltage in terms of input | Rg = 10 Kohm<br>BPF = 20Hz-20KHz | | | 0.9 | mVrms |
| Pout | Maximum output | THD = 10% | 2 | | | W |
| Icc | Current in the absence of signal | | 20 | 32 | 40 | mA |
| V 2 | Voltage at pin P 2 | Voltage measurement during 10-μA application | 1.0 | 1.2 | 1.4 | V |
| V 4 | Voltage at pin P 4 | Voltage measurement during 10-μA application | 1.0 | 1.2 | 1.4 | V |
| NC 5 | NC check at pin P 5 | Voltage measurement during 10-μA application | 1.9 | 2.0 | 2.1 | V |
| LEAK 2 | Leak current at pin P 2 | Voltage measurement during 0.4-V application | −0.1 | 0.4 | 1.0 | μA |

Figure 4A:
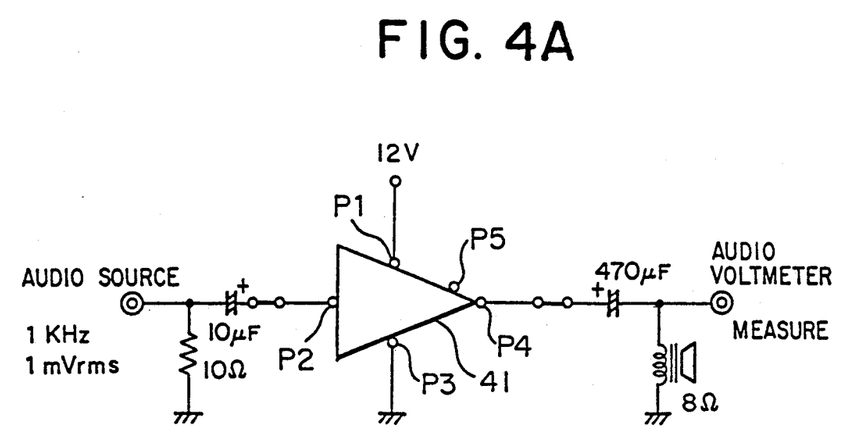
FIGS. 4A and 4B are circuit diagrams respectively showing testing peripheral circuits for individual measurement items.
Figure 4B:
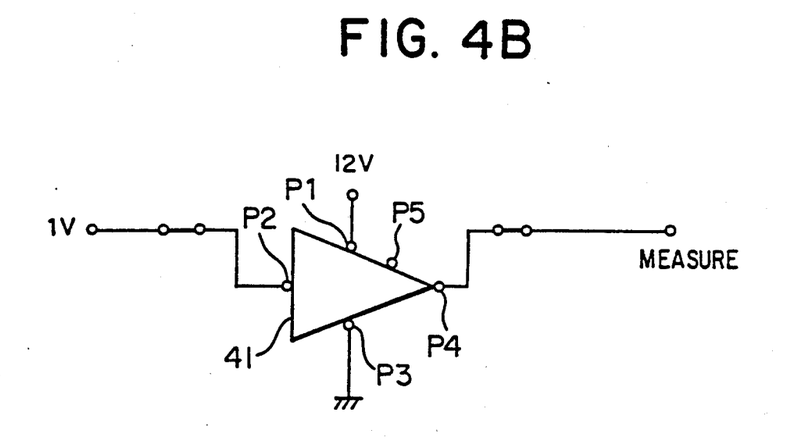

When the above measurement standard is input from the input device 11, the testing peripheral circuit diagram preparing section 12 reads the basic peripheral circuit diagram of the electronic circuit from the testing peripheral circuit data base 13 to display the circuit diagram on the display of the input device 11. An operator adds testing peripheral circuit modules to the basic peripheral circuit diagram in a conversational mode, thereby preparing a testing peripheral circuit diagram for each individual measurement item. By way of example, FIGS. 4A and 4B show the testing peripheral circuit diagrams which are respectively prepared on the basis of the voltage gain and the voltage at the pin P4, each of which is one of the measurement items of Table 1.

a similar manner, measurement specifications for the other measurement items are prepared, respectively.

When the measurement specifications for the respective measurement items are tabulated, a table of measurement specifications, such as Table 2, is obtained.

TABLE 2

| | | Measurement Specifications | | | | | | | | |
|---|---|---|---|---|---|---|---|---|---|---|
| | | Terminal condition | | | | | Change-over switch | | | Audio voltmeter |
| Symbol | | XPT-1 | XPT-2 | XPT-3 | XPT-4 | Audio source | SW 1 | SW 2 | SW 3 | SW 4 | |
| Gv | Voltage gain | | 12 V | | | 1 kHz, 1 mVrms | off | on | off | on | (M) |
| THD | Total harmonic distortion | | 12 V | | | adjusted to a 1-mVrms output at 1 kHz | off | on | off | on | (M) |
| Fb | Frequency characteristic | | 12 V | | | 10 kHz, 1 mVrms | off | on | off | on | (M) |
| Ni | Noise voltage in terms of input | | 12 V | | | off | off | on | off | on | (M) |
| Pout | Maximum output | | 12 V | | | adjusted to 1 kHz and THD 10% | off | on | off | on | (M) |
| Icc | Current in the absence of signal | | 12 V (M) | | | | off | on | off | on | |
| V 2 | Voltage at pin P 2 | 10 μA (M) | 12 V | | | | on | off | on | off | |
| V 4 | Voltage at pin P 4 | 1 V | 12 V | | (M) | | on | off | on | off | |
| NC 5 | NC check at pin P 5 | | 12 V | 10 μA (M) | | | on | off | on | off | |
| LEAK 2 | Leak current at pin P 2 | 0.4 V (M) | | | | | on | off | on | off | |

Figure 5:
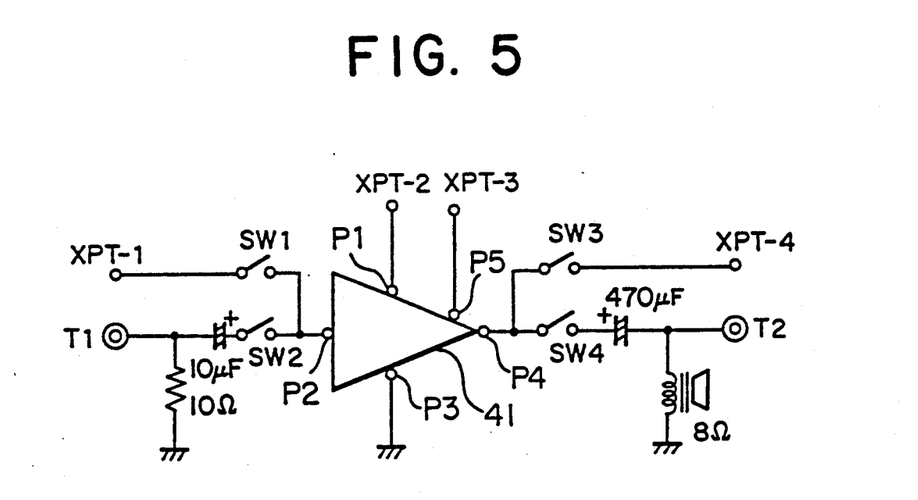
FIG. 5 is a circuit diagram showing an overall testing peripheral circuit.

If the thus-prepared testing peripheral circuit diagrams for the respective measurement items are synthesized with one another, then the overall testing peripheral circuit diagram shown in FIG. 5 is prepared. This overall testing peripheral circuit has a construction in which change-over switches SW1-SW4 and terminals XPT-1-XPT-4 are added to the peripheral circuit of FIG. 3, and is arranged to enable measurements corresponding to all the measurement items of Table 1.

Figure 6A:
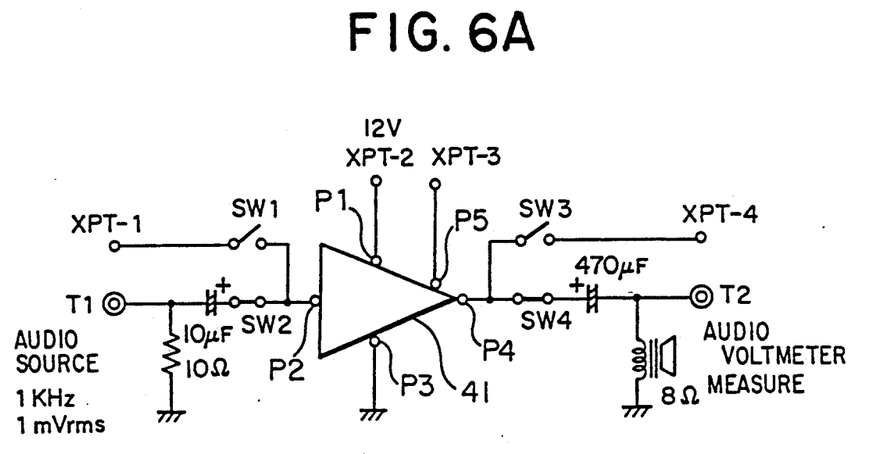
FIGS. 6A and 6B are measurement specifications for individual measurement items.
Figure 6B:
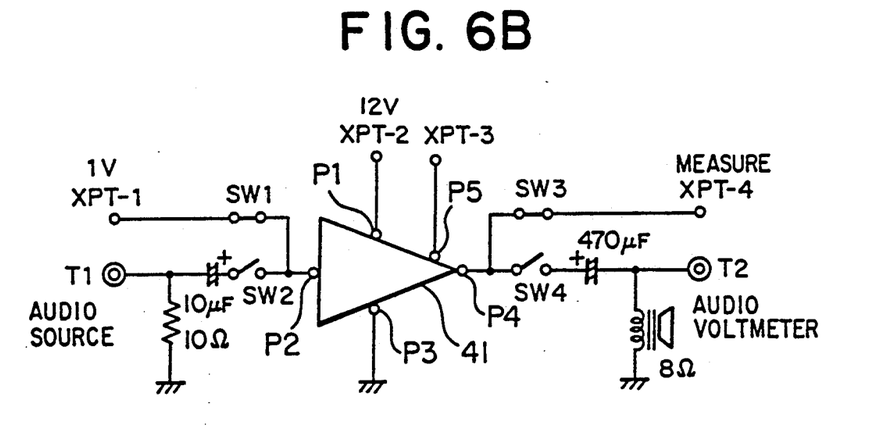

Then, an interface circuit is designed, and connection data for the measurement jig as well as control data is registered. Thereafter, the testing peripheral circuit diagram of FIG. 4A is compared to the overall testing peripheral circuit diagram of FIG. 5 to display, on the overall testing peripheral circuit diagram, the measurement conditions shown on the testing peripheral circuit diagram, thereby providing the measurement specifications, shown in FIG. 6A, for measurement of voltage gain. More specifically, in this measurement, the change-over switches SW1 and SW3 are switched off, while the change-over switches SW2 and SW4 are switched on. Simultaneously, a source voltage 12V is applied to the terminal XPT-2, while a voltage of 1 mVrms with 1kHz is applied through an input terminal T1 to which an audio source (not shown) is connected. An audio voltmeter (not shown) is connected to an output terminal T2 to measure the voltage developed at the output terminal T2. On the other hand, the measurement specifications, shown in FIG. 6B, for measurement of the voltage at the pin P4 is obtained from the testing peripheral circuit diagram of FIG. 4B and the overall testing peripheral circuit diagram of FIG. 5. In Incidentally, the measurement specification preparing apparatus shown in FIG. 1 may be constituted by a personal computer, an engineering work station (EWS) or the like.

Further, if testing peripheral circuit modules which can be adapted to various kinds of measurement apparatus are stored in advance in the testing peripheral circuit data base 13, then it is possible to prepare measurement specifications irrespective of the kind of measurement apparatus.

Further, if the form of measurement specifications is standardized, then it is also possible to automatically prepare a measurement program from the measurement specifications prepared by the measurement specification preparing section 14.

What is claimed is:
1. A method for preparing measurement specifications for use in making measurements of a plurality of measurement items of the properties of an electronic circuit comprising the steps of:
   preparing a plurality of testing peripheral circuit diagrams for individual measurement items by adding selected standardized testing peripheral circuit modules which correspond to the plurality of measurement items read from a testing peripheral circuit data base which stores the standardized testing peripheral circuit modules in response to user commands to a basic peripheral circuit diagram of the electronic circuit;
   preparing an overall testing peripheral circuit diagram for use in making measurements correspond- ing to all the measurement items by synthesizing said plurality of testing peripheral circuit diagrams with one another; and preparing an overall testing peripheral circuit diagram for use in making measurements corresponding to all the measurement items by synthesizing said plurality of testing peripheral circuit diagrams with one another; and preparing measurement specifications on a computer or engineering work station for individual measurement items for use in making measurements employing the overall testing peripheral circuit diagram from the overall testing peripheral circuit diagram and the plurality of testing peripheral circuit diagrams.

2. A method according to claim 1, wherein said step of preparing measurement specifications includes preparing the overall testing peripheral circuit diagram and the requisite matter written thereon.

3. A method according to claim 1, wherein said step of preparing measurement specifications includes representing the measurement specifications in a tabulated form.

4. An apparatus for preparing measurement specifications for use in making measurements of a plurality of measurement items of properties of an electronic circuit comprising:

input means for receiving and outputting the measurement items and measurement standard of the electronic circuit;

a data base for storing and outputting a basic peripheral circuit diagram of the electronic circuit and a plurality of testing peripheral circuit modules which are standardized in advance;

testing peripheral circuit diagram preparing means, connected to said input means for receiving the measurement items and measurement standard from said input means and to said data base for receiving the basic peripheral circuit diagram and the testing peripheral circuit modules, for preparing and outputting a plurality of testing peripheral circuit diagrams for individual measurement items by adding selected ones of the testing peripheral circuit modules stored in said data base to the basic peripheral circuit diagram stored in said data base on the basis of the measurement items and measurement standard of the electronic circuit, and for (b) preparing and outputting an overall testing peripheral circuit diagram for use in making measurements corresponding to all the measurement items by synthesizing the plurality of testing peripheral circuit diagrams with one another;

measurement specification preparing means, connected to said testing peripheral circuit diagram preparing means for receiving the overall testing peripheral circuit diagram and the plurality of testing peripheral circuit diagrams, for preparing measurement specifications for individual measurement items for use in making measurements employing the overall testing peripheral circuit diagram from the overall testing peripheral circuit diagram and the plurality of testing peripheral circuit diagrams; and output means for outputting said measurement specifications prepared by said measurement specification preparing means.

5. An apparatus according to claim 4, wherein said input means includes a keyboard and a display.

* * * * *